United States Patent [19]

Lewis et al.

[11] Patent Number: 5,313,595
[45] Date of Patent: May 17, 1994

[54] AUTOMATIC SIGNAL TERMINATION SYSTEM FOR A COMPUTER BUS

[75] Inventors: Mark S. Lewis; Ronald R. Ravey, both of Colorado Springs, Colo.

[73] Assignee: Digital Equipment Corporation, Maynard, Mass.

[21] Appl. No.: 988,773

[22] Filed: Dec. 10, 1992

[51] Int. Cl.5 .................... G06F 13/00; H03H 11/28; H04B 3/00

[52] U.S. Cl. ...................... 395/325; 375/36; 307/443; 364/240; 364/239.9; 364/DIG. 1

[58] Field of Search .............. 395/325, 275, 800; 375/36, 99; 370/85.1; 307/147, 443; 178/63 R, 340/825.52; Dialog Files 2, 6, 8, 108, 144, 350, 351, 237, 256, 278, 751, 233, 275

[56] References Cited

U.S. PATENT DOCUMENTS

| | | | |
|---|---|---|---|
| 4,575,759 | 3/1986 | Griepentrog et al. | 358/181 |
| 4,631,721 | 12/1986 | Ono et al. | 370/85 |
| 4,920,339 | 4/1990 | Friend et al. | 340/825.52 |
| 5,029,284 | 7/1991 | Feldbaumer et al. | 307/443 |
| 5,099,137 | 3/1992 | Lattin, Jr. | 307/147 |
| 5,120,909 | 6/1992 | Kutz et al. | 178/63 R |
| 5,239,559 | 8/1993 | Brach et al. | 375/36 |
| 5,239,658 | 8/1993 | Yamamuro et al. | 395/800 |

OTHER PUBLICATIONS

UC5601-Small Computer System Interface Active Terminator Chip Integrated Circuits Unitrode, from Component Sales, Inc.

*Primary Examiner*—Gopal C. Ray
*Attorney, Agent, or Firm*—Albert P. Cefalo; Ronald C. Hudgens

[57] ABSTRACT

An automatic termination system for an end terminated bus especially useful with the SCSI bus. When utilized with a computer device, for example, a storage subsystem, configuration or reconfiguration of the bus can be automatically effectuated without concerns for inappropriate signal termination of the bus. The invention comprises a circuit which determines if any additional devices have been coupled to the bus and enables an active terminator chip if none is detected. Should another device be coupled onto the bus, the active terminator chip is automatically disabled.

16 Claims, 3 Drawing Sheets

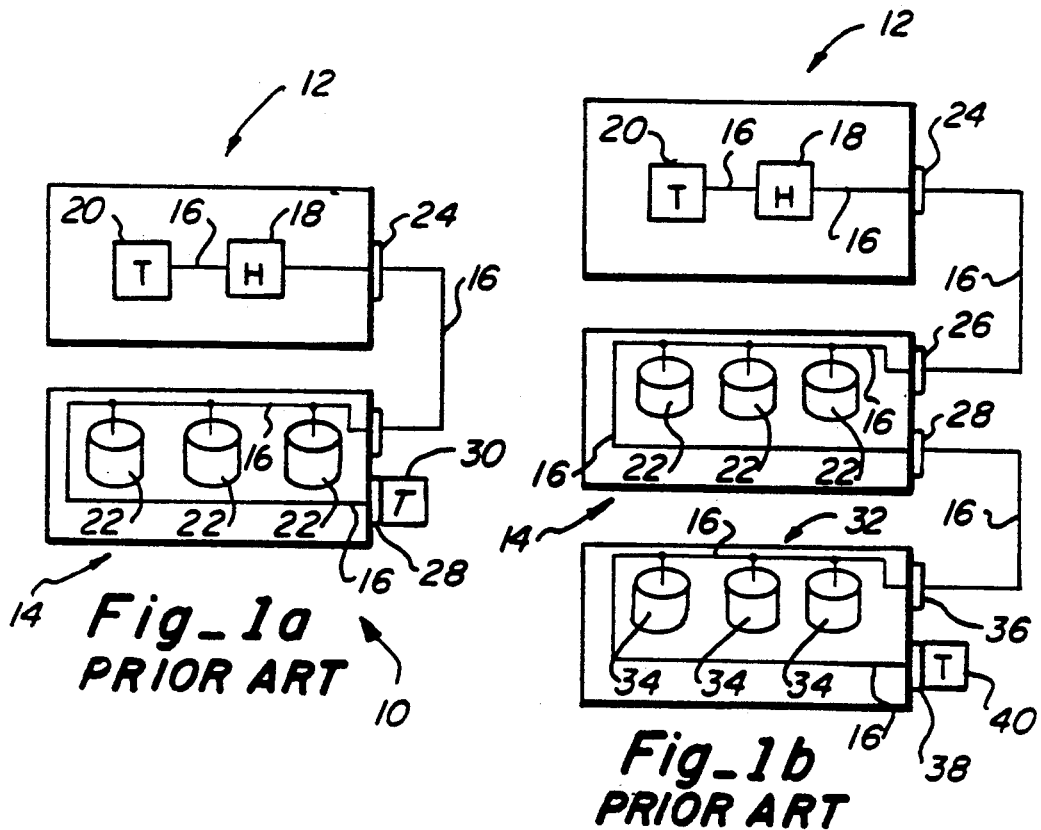
Fig_1a PRIOR ART
Fig_1b PRIOR ART
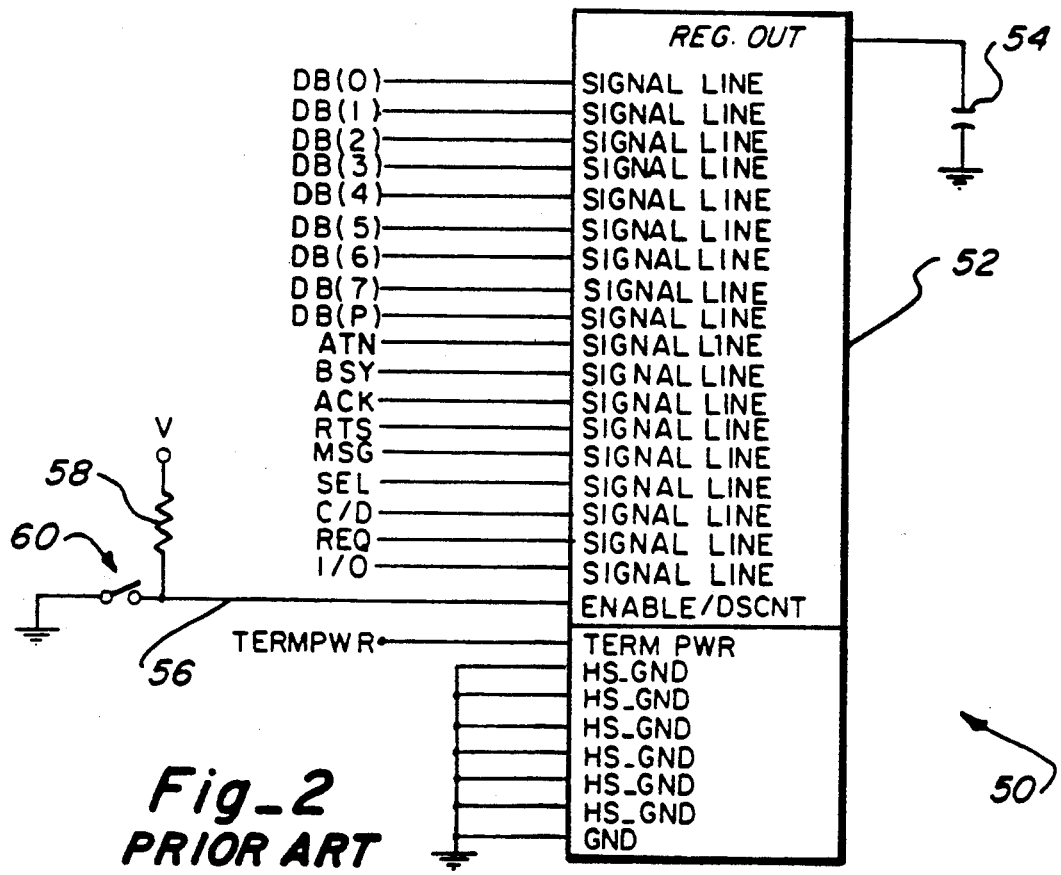
Fig_2 PRIOR ART

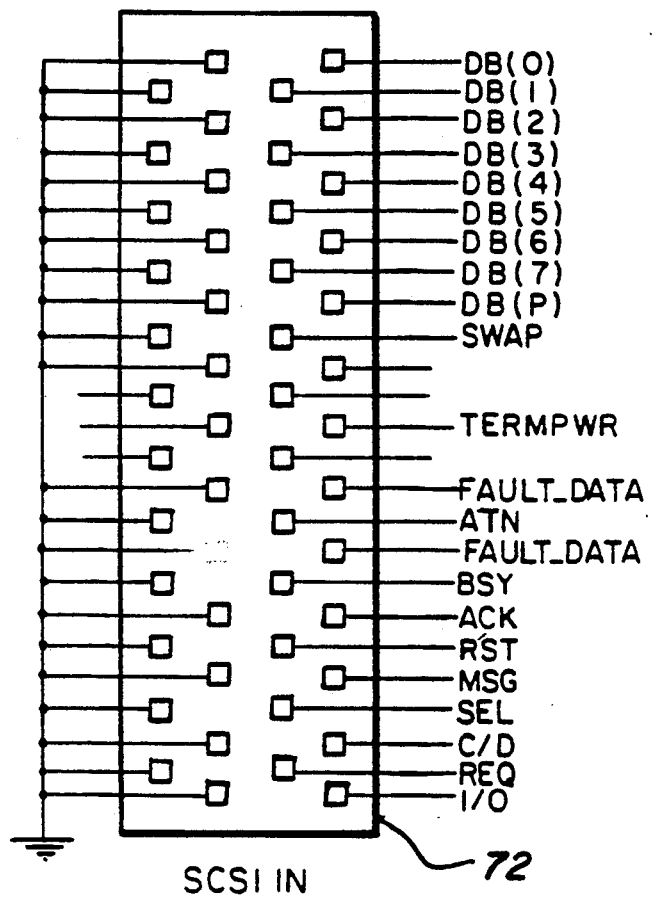
Fig_3a

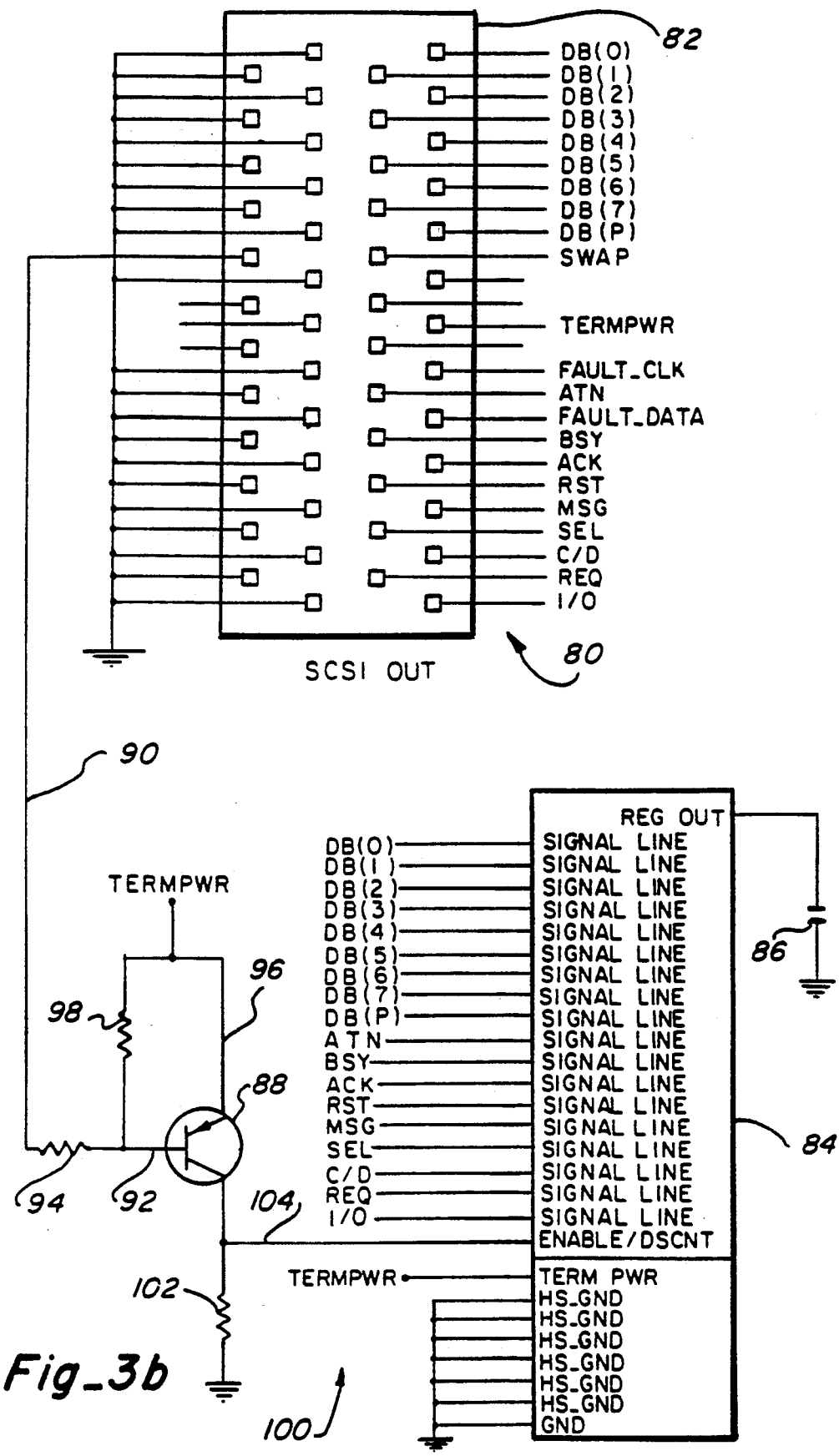
Fig_3b

AUTOMATIC SIGNAL TERMINATION SYSTEM FOR A COMPUTER BUS

BACKGROUND OF THE INVENTION

The present invention relates, in general, to the field of computer bus signal termination systems. More particularly, the present invention relates to an automatic signal termination system for a computer bus of especial utility with daisy chain busses requiring end termination such as the small computer system interface (SCSI).

The SCSI bus is a parallel, multimaster input/output (I/O) bus which has become a de facto standard for interconnection of computers and peripheral devices since its adoption as an ANSI standard in 1986. SCSI (8-bit) can support up to eight devices (host adapters or peripheral controllers) although each device can have eight logical units, with each logical unit having 256 logical subunits. The SCSI bus can be either single ended, wherein each signal's logic level is determined relative to a common ground, or differential wherein the logic level is determined between pairs of conductors. SCSI-2, which evolved from the original SCSI specification, standardized the way bus terminators are powered, makes certain messages and command sets mandatory and provides for two optional enhancements to increase bus throughput, which are: fast SCSI (up to 10,000,000 byte transfers per second) and wide SCSI (16 or 32 bit wide data path). SCSI is, therefore, a robust and popular bus for the interconnection of computer host and peripheral devices.

The SCSI bus must, however, be terminated at both ends (and only at the ends) for proper operation. In fact, the SCSI-2 standard for single ended SCSI recommends active termination at both ends of every cable segment. Should the bus not be terminated properly, the devices coupled to the bus may either cease functioning properly, thereby introducing serious error problems, or cease functioning at all. Conversely, should the SCSI bus be "over" terminated, i.e. terminated at more places than the ends, signal reflections and other signal complications will likewise lead to high failure rates and errors.

As additional host adapters or peripheral controllers are added to an existing SCSI bus (or the buses are reconfigured), care must be exercised in properly configuring the bus terminators. Previously, termination has been effectuated by means of passive single inline package (SIP) resistor packages, loop back connectors or other relatively expensive terminator plugs. Thus, a knowledgeable technician must accurately access the bus configuration and terminate the bus ends properly as well as take care that such removable devices are not misplaced or lost if the configuration is changed.

Recently, active terminator devices have become available to ameliorate problems attendant misplaced or lost terminator plugs, SIP resistor packs or loop back connectors. Such active devices, as for example the UC 5601 small computer system interface active terminator available from Unitrode Integrated Circuits provide active termination for all 18 SCSI signal lines by resistive pull up to a 2.9 volt reference. A disconnect signal will also effectively remove the terminating resistors from the bus. Nevertheless, appropriate enablement or disablement of a given active terminator, as with the passive terminators, still requires a rather sophisticated degree of technical competence, ordinarily beyond the capacity of the average end user. The addition of a peripheral device to a previously configured bus is therefore, still too complex for a customer who must, of necessity, be schooled in what switch to throw or jumper connection to make to configure his system.

Certain SCSI computers from Apple Computers, Inc., for example the McIntosh SE, have nevertheless had power supplies too weak to power a terminator thereby still requiring the addition of one or two external terminators when connecting SCSI devices. The instructions for adding the external terminators fill a few pages of the relevant manuals.

The existing passive and active termination techniques have, therefore, relegated the task of properly terminating the SCSI bus to only those with sufficient training and knowledge. Even for those with the requisite skills the task nevertheless remains time consuming and tedious.

SUMMARY OF THE INVENTION

The straight forward and inexpensive automatic signal termination system of the present invention overcomes serious limitations of the prior art and makes reconfiguration or the addition of other computer devices to an end terminated bus expeditious and relatively error free. Disclosed herein is a signal terminator for a computer bus having a number of devices coupled thereto which includes a signal termination means which operates between a first signal termination state and a second termination disconnect state. Means for automatically detecting an additional device coupled to the bus are provided which operatively control the signal termination means whereby, in operation, the signal termination means will transition from the first signal termination state to the second termination disconnect state if an additional device is detected by the detecting means.

Also disclosed herein is an automatic termination system for a computer bus having n devices coupled thereto which includes a first signal terminator associated with a first end of the bus. A second signal terminator is associated with a second opposite end of the bus and is operative between a first signal termination state and a second termination disconnect state. Means for automatically detecting an n+1 device coupled to the bus at the second end thereof operatively control the second signal terminator whereby, in operation, the second signal terminator will transition from the first to the second states thereof when the n+1 device is coupled to the bus and from the second to the first state thereof when the n+1 device is not coupled to the bus.

Additionally disclosed is a computer device for coupling to an additional computer device requiring signal termination at opposite ends of the bus wherein the computer device includes an input portion for coupling the device to the bus at one of the ends thereof and an output portion for discretionary coupling of an additional computer device to the bus. Means for automatically detecting the coupling of the additional computer device to the output portion of the computer device and means responsive to the detecting means provide signal termination when the additional computer device is not coupled to the output portion of the computer device and provide no signal termination when the additional computer device is coupled to the output portion of the computer device.

BRIEF DESCRIPTION OF THE DRAWINGS

The above-mentioned and other features and objects of the present invention and the manner of attaining them will become more apparent and the invention itself will be best understood by reference to the following description of an embodiment of the invention taken in conjunction with the accompanying drawings, wherein:

FIG. 1a is a simplified representation of a prior art computer system utilizing an end terminated bus, for example SCSI, as an external bus from a host system to a mass storage expansion system and illustrating the terminators required at the computer bus ends;

FIG. 1b is a simplified representation of the prior art computer system of FIG. 1a illustrating how the reconfiguration of an end terminated bus requires removal of a bus terminator and changing of the bus termination point when adding an additional computer device to the bus such as another mass storage expansion system;

FIG. 2 is a schematic illustration of a prior art active termination system utilizing a commercially available active terminator chip requiring, for example, the manual setting of a switch to enable termination of the 18 signal lines on a single ended SCSI bus;

FIG. 3a schematic illustration of a SCSI input connector for use in conjunction with a computer device in accordance with the present invention, specifying the various signal and signal ground connections of a single ended SCSI bus; and FIG. 3b is a schematic illustration of a SCSI output connector and associated automatic termination system of the present invention for incorporation with the input connector of FIG. 3a within a computer device such as a mass storage expansion system.

DESCRIPTION OF PREFERRED EMBODIMENT

With reference to FIG. 1a, an exemplary prior art computer system 10 is shown. Prior art computer system 10 comprises host system 12 and associated mass storage expansion system 14. Computer bus 16 interconnects host system 12 and mass storage expansion system 14 for bidirectional communication between devices coupled to the bus.

Host system 12 comprises, in pertinent part, a host adapter 18 coupled to computer bus 16. Terminator 20 within host system 12 terminates one end of computer bus 16 as shown. Mass storage expansion system 14 may comprise, as shown, a plurality of storage devices 22 which are illustrated as being disk drives. Storage devices 22 are likewise coupled to computer bus 16 which is input to mass storage expansion system 14 through expansion system input connector 26. Computer bus 16 is terminated by means of terminator 30 associated with expansion system output connector 28. Terminator 30 may comprise a SIP resistor pack, terminator plug or loop back connector.

Referring additionally now to FIG. 1b, the prior art computer system 10 of FIG. 1a is illustrated with computer bus 16 being reconfigured or extended to include an additional mass storage expansion system 32. With reference to FIG. 1b, like structure to that previously described with respect to FIG. 1a is like numbered. Additional mass storage expansion system 32 may comprise, as shown, a plurality of storage devices 34 coupled to computer bus 16. Computer bus 16 is now additionally coupled to expansion system output connector 28 and additional expansion system input connector 36 by removal of terminator 30 from expansion system output connector 28. Computer bus 16 is now terminated by means of terminator 40 at an associated additional expansion system output connector 38. Terminator 40 may likewise comprise the same devices as previously described with respect to terminator 30.

It can be seen that reconfiguration of computer bus 16, by adding additional mass storage expansion system 32, requires removal of terminator 30 and the addition of terminator 40. The individual configuring the prior art computer system 10 must have sufficient technical knowledge to insure that computer bus 16 is terminated only at the ends thereof and not "over" terminated through the inadvertent addition of too many terminators. It can also be seen, that it is possible to lose or misplace either of terminators 30, 40 and the omission of terminator 40 would cause errors to appear on the bus or a complete lack of functionality.

Referring now to FIG. 2, a prior art active termination system 50 is shown. Prior art active termination system 50 comprises, in pertinent part, active terminator device or chip 52. Active terminator chip 52 may comprise a commercially available integrated circuit device such as the UC 5601 available from Unitrode Integrated Circuits. The UC 5601 device is particularly adapted for the SCSI bus and provides active termination for the 18 signal lines of the SCSI bus by resistive pull up to a 2.9 volt reference. A disconnect feature causes the UC 5601 device to disconnect all terminating resistors thereby ending bus termination.

Prior art active terminative system 50 is activated, thereby terminating the bus, by means of an enable low signal applied to enable line 56 connected to the ENABLE/DSCNT input of active terminator chip 52. Enable line 56 is held at a logic high level through use of pull up resistor 58 coupling a source of voltage (V) to enable line 56. Switch 60, having one terminal connected to circuit ground, can be used to bring enable line 56 to a logic low level through its closure. Switch 60 may, in some systems, be functionally replaced by a jumper. Thus, in operation, active terminator chip 52, which further includes capacitor 54 coupling its REG OUT output to circuit ground, provides resistive pull up to the 18 signal lines shown when switch 60 couples enable line 56 to circuit ground. The resultant logic low level appearing on enable line 56 causes active terminator chip 52 to pull up the 18 signal lines shown to an approximately 2.9 volt reference. Conversely, opening switch 60 causes enable line 56 to reach a logic high level by means of pull up resistor 58 thereby providing for a non-terminated condition on the 18 SCSI signal lines shown. The additional inputs to active terminator chip 52 include a terminator power input (TERM PWR) and ground input (GND) as well as 6 heat sink grounds (HS_GND).

The SCSI bus utilizes 9 data lines and 9 control signals. The 9 data lines designated DB (0) through DB (7), and DB (P) form a bidirectional data bus with optional parity. These lines, in addition, carry the SCSI ID's of devices when they contend for the bus and when they establish (or re-establish) connections with other devices. Each ID corresponds to one line on the bus being active.

ATN (attention) line is a signal asserted by the host to let a controller know that it has a message for it. The controller can then ask for the message using the MESSAGE OUT bus phase.

BSY (busy) is a signal asserted by one or both of the parties to a transaction to indicate that the bus is in use.

ACK (acknowledge) is a line asserted by the initiator to acknowledge that it has accepted or supplied data in response to the REQ signal asserted by the target. All asynchronous data transfers over the SCSI bus use the REQ/ACK handshake sequence.

RST (reset) is a signal which resets the bus. Any device on the bus can assert it and it is normally used only at power-up time or when a selected device is not responding.

MSG (message) is a signal controlled by the target device which indicates when a message is on the bus.

SEL (select) is a signal used by the host to specify the controller that it wishes to talk to or vice versa. The ID of the device being selected appears on the data lines.

C/D (control/data) is a signal controlled by the target during a transaction which indicates whether control information or data is on the bus.

REQ (request) is a signal asserted by the target to begin an asynchronous bus transfer using the REQ-/ACK handshake sequence.

I/O (input/output) is a signal which indicates the direction of a data transfer relative to the initiator. It is driven by the target and also distinguishes between the SELECTION and RESELECTION bus phases.

Referring now to FIG. 3a, a computer device bus input section 70 in accordance with the present invention is illustrated comprising a conventional high density SCSI connector 72 as shown. With reference to computer device bus input section 70, like data and signal lines to those previously described with respect to FIG. 2 are like designated. Computer device bus input section 70 further includes signal lines designated SWAP, FAULT_CLK and FAULT_DATA. In a conventional single-ended SCSI bus, these signal lines may also be ground. As can be additionally seen, a number of ground pins are provided to provide shielding between the data and signal lines. All data and signal lines are active low with the exception of TERMPWR, FAULT$_{13}$ CLK and FAULT_DATA which are active high.

Referring additionally now to FIG. 3b a computer device output section 80 in conjunction with automatic termination system 100 in accordance with the present invention is shown. Computer device bus output section 80 and automatic termination system 100 are, preferably, incorporated within a computer device, for example a storage expansion system, with computer device bus input section 70. A SCSI bus will be connected to computer device bus input section 70 for enabling a number of SCSI devices to be coupled to the SCSI bus between computer device bus input section 70 and computer device bus output section 80. Computer device bus output 80 allows for the attachment of an additional SCSI bus segment for coupling an additional computer device thereto. Should an additional computer device not be coupled to the SCSI bus at computer device bus output section 80, termination of the bus must occur thereat to maintain signal integrity.

The SCSI signal and ground-lines to connector 82 of computer device bus output section 80 are the same as those for computer device bus input section 70 of FIG. 3a, with the exception that the ground-line at pin 10 has been utilized as a detection input point 90. Although pin 10 of connector 82 has been chosen for detection input point 90 in the embodiment illustrated, it can be readily determined that any suitable ground pin may likewise be removed from circuit ground to form detection input point 90. It should also be noted that electrically "floating" pin 10 causes no signal degradation on the bus.

Detection input point 90 forms an input to automatic termination system 100 comprising, in pertinent part, active terminator chip 84 (such as a UC 5601 device available Unitrode Integrated Circuits) having its REG OUT pin coupled to circuit ground by means of capacitor 86. Automatic termination system 100 further comprises PNP transistor 88 having its emitter lead connected to TERMPWR. Detection input point 90 is connected to the base lead 92 of PNP transistor 88 through resistor 94 as shown. Resistor 98 likewise couples TERMPWR to base lead 92. Resistor 102 couples circuit ground to enable line 104 which is likewise connected to the collector lead of PNP transistor 88. Enable line 104 is connected to the enable/disconnect input of active terminator chip 84 of the automatic termination system 100 as shown. Resistors 94, 98 and 102 may be 10K ohm, ¼ watt units with capacitor 86 a 1 microfarad, 25 volt device. PNP transistor 88 may be an industry standard MMBT4403 device.

In operation, when no additional computer device is plugged into computer device bus output section 80, pin 10 of connector 82 will not be connected to circuit ground but will instead, "float". Thus, detection input point 90 is not at circuit ground when an additional computer device is not plugged into computer device bus output section 80. In this manner, PNP transistor 88 is not biased on to a conductive state and, therefore, enable line 104 remains at a logic low level causing active terminator chip 84 to pull up the 18 data and signal lines of the SCSI bus thereby terminating the bus.

Should an additional computer device be plugged into computer device bus output section 80, pin 10 will thereby become connected to circuit ground through that portion of the SCSI bus. Thus, detection input section 90 will transition from a "floating" condition to circuit ground with respect to automatic termination system 100. In operation, the voltage divider network created by resistors 98 and 94 will bias PNP transistor 88 into a conducting condition thereby causing enable line 104 to attain a logic high level which, in turn, causes a disconnect of the terminating resistors of active terminator chip 84 to the 18 SCSI data and signal lines.

As can be seen, since the SCSI standard requires that each device have an associated terminator, any additional SCSI device can be coupled to the SCSI bus through computer device bus output 80 and cause the appropriate removal of the existing termination thereat automatically. The automatic signal termination system of the present invention therefore allows a given storage expansion unit or other computer device to automatically determine whether it should end termination of the SCSI bus upon the addition of another computer device to an already terminated bus. Conversely, removal of an additional computer device will automatically effectuate termination of the SCSI bus at the appropriate point. Thus, the individual configuring the system would not require detailed technical knowledge of the system configuration or of how to properly terminate the bus. As a result, any end terminated bus utilizing the present invention is much more readily configured and reconfigured. The present invention, while obviating passive devices for terminations such as SIP resistor packs, terminator plugs or loop back connectors, also obviates the manual setting of dual in-line pin (DIP) switches or circuit board jumpers in configuring a computer system.

While there have been described above the principles of the present invention in conjunction with specific apparatus, it is to be clearly understood that the foregoing description is made only by way of example and not as a limitation to the scope of the invention.

What is claimed is:

1. An automatic termination system for a computer bus having n devices coupled thereto, comprising:
   a first signal terminator associated with a first end of said bus;
   a second signal terminator associated with a second end of said bus, said second signal terminator being operative to selectively achieve either one of a first signal termination state in which signal lines of said bus are terminated and a second termination disconnect state in which said signal lines of said bus are not terminated; and
   means connected to said second signal terminator for automatically detecting an n+1 device coupled to said bus at said second end thereof and in response to the detection of the n+1 device controlling said second signal terminator to transition from said first signal termination state to said second termination disconnect state and for controlling said second signal terminator to transition from said second termination disconnect state to said first signal termination state when said n+1 device is not coupled to said bus.

2. The automatic termination system of claim 1 wherein said computer bus comprises a SCSI bus.

3. The automatic termination system of claim 1 wherein said second signal terminator comprises an active terminator chip.

4. The automatic termination system of claim 1 wherein said detecting means comprises means for checking a portion of said computer bus for a low impedance level ground when said n+1 device is coupled to said bus.

5. The automatic termination system of claim 4 wherein said checking means comprises a semiconductor switching device.

6. The automatic termination system of claim 1 wherein said second signal terminator and said detecting means further comprise a mass storage expansion system.

7. A signal terminator for a computer bus having a number of devices coupled thereto comprising:
   singal termination means for connection to the bus and operative between a first signal termination state and a second termination disconnnect state thereof; and
   means operatively controlling said signal termination means for automatically detecting an additional device coupled to said bus
   so that said signal termination means will transition from said first signal termination state to said second termination disconnect state thereof if said additional device is detected by said detecting means.

8. The signal terminator of claim 7 wherein said computer bus comprises a SCSI bus.

9. The signal terminator of claim 7 wherein said signal termination means comprises an active termination chip.

10. The signal terminator of claim 7 wherein said detecting means further comprises means for checking a portion of said computer bus for a low impedance ground when said additional device is coupled to said bus.

11. The signal terminator of claim 7 further comprising a mass storage expansion system.

12. A computer device for coupling to a computer bus, said computer bus requiring signal termination at opposite ends thereof, said computer device including an input portion for coupling said computer device to said computer bus at one of said ends thereof and an output portion for discretionary coupling of an additional computer device to said computer bus wherein the improvement comprises:
   means coupled to said output portion for automatically detecting the coupling of said additional computer device to said output portion of said computer device; and
   means operative in response to said detecting means for providing signal line termination for said computer bus when said additional computer device is not coupled to said output portion of said computer device and providing no signal line termination when said additional computer device is coupled to said output portion of said computer device.

13. The computer device of claim 12 wherein said detecting means is responsive to a low impedance level ground on a portion of said computer bus when said additional computer device is coupled to said output portion of said computer device.

14. The computer device of claim 13 wherein said detecting means comprises a semiconductor switching device.

15. The computer device of claim 12 wherein said signal termination providing means comprises an active terminator chip.

16. The computer device of claim 12 wherein said computer bus comprises a SCSI bus.

* * * * *